United States Patent
Cho

(10) Patent No.: US 8,039,863 B2
(45) Date of Patent: Oct. 18, 2011

(54) LIGHT EMITTING DEVICE

(75) Inventor: Bum Chul Cho, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 164 days.

(21) Appl. No.: 12/436,522

(22) Filed: May 6, 2009

(65) Prior Publication Data

US 2009/0278153 A1   Nov. 12, 2009

(30) Foreign Application Priority Data

May 7, 2008 (KR) .................. 10-2008-0042236

(51) Int. Cl.
  *H01L 33/62* (2010.01)
(52) U.S. Cl. .................. 257/99; 257/98; 257/E33.057; 257/E33.066; 257/E33.065
(58) Field of Classification Search .................. 257/98, 257/E33.067, E33.068, E33.057, E33.066, 257/99, E33.065
See application file for complete search history.

(56) References Cited

U.S. PATENT DOCUMENTS

| | | | |
|---|---|---|---|
| 6,946,714 B2* | 9/2005 | Waitl et al. ................ | 257/434 |
| 7,675,081 B2* | 3/2010 | Low et al. .................. | 257/98 |
| 2004/0016873 A1* | 1/2004 | Kida et al. ................ | 250/214 R |
| 2008/0006837 A1* | 1/2008 | Park et al. .................. | 257/98 |
| 2008/0012036 A1* | 1/2008 | Loh et al. .................. | 257/99 |
| 2008/0029775 A1* | 2/2008 | Liu et al. .................. | 257/98 |
| 2008/0054286 A1* | 3/2008 | Loh et al. .................. | 257/98 |

* cited by examiner

*Primary Examiner* — Victor A Mandala
*Assistant Examiner* — Scott Stowe
(74) *Attorney, Agent, or Firm* — Birch, Stewart, Kolasch & Birch, LLP

(57) ABSTRACT

Provided is a light emitting device. The light emitting device comprises a package body, a plurality of electrodes, a light emitting diode, and a lens. The package body comprises a trench. The plurality of electrodes is disposed on and/or in the package body. The light emitting diode is disposed on the package body and is electrically connected to the electrodes. The lens is disposed on an inner side of the trench.

7 Claims, 7 Drawing Sheets

LIGHT EMITTING DEVICE

CROSS-REFERENCE TO RELATED APPLICATIONS

The present application claims priority under 35 U.S.C. 126 to Korean Patent Application No. 10-2008-0042236 (filed on May 7, 2008), which is hereby incorporated by reference in its entirety.

BACKGROUND

Embodiments relate to a semiconductor light emitting device.

Light Emitting Diodes (LEDs) use GaAs, GaN, InGaN and InGaAlP-based compound semiconductor materials to constitute a light emitting source, thereby realizing various colors.

Characteristics of the LEDs are determined depending on materials, colors, brightness and brightness intensity of the compound semiconductor materials. In addition, the LEDs are fabricated in the form of package and are applied to various fields of a lightening indicator, a character displayer and an image displayer.

SUMMARY

Embodiments provide a light emitting device comprising a package body comprising a trench around a light emitting diode.

Embodiments provide a light emitting device in which a cavity and a trench are defined on/around a package body to prevent a resin from overflowing.

An embodiment provides a light emitting device comprising: a package body comprising a trench; a plurality of electrodes on and/or in the package body; a light emitting diode on the package body, the light emitting diode being electrically connected to the electrodes; and a lens on an inner side of the trench.

An embodiment provides a light emitting device comprising: a package body comprising a cavity to an inner side thereof and a trench around the outside of the cavity; a plurality of electrodes on and/or in the package body; at least one light emitting diode in the cavity; a resin material in the cavity; and a lens in which an outer surface thereof is disposed in the trench, the lens being disposed on the resin material.

An embodiment provides a light emitting device comprising: a package body comprising a cavity in which a lateral surface is inclined and a trench around the outside of the cavity; a plurality of electrodes on and/or in the package body; a light emitting diode in the cavity; a resin material in the cavity; and a lens inside the trench and on the resin material.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device according to embodiments will be described with reference to the accompanying drawings.

Figure 1:
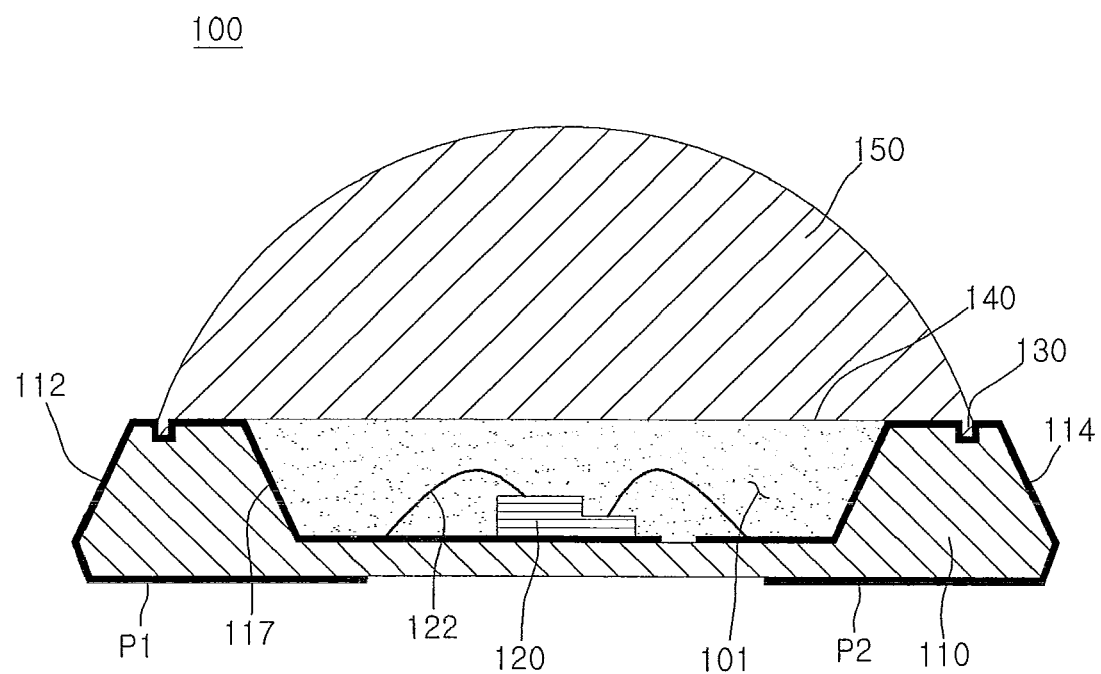
FIG. 1 is a side-sectional view of a light emitting device according to a first embodiment.
Figure 2:
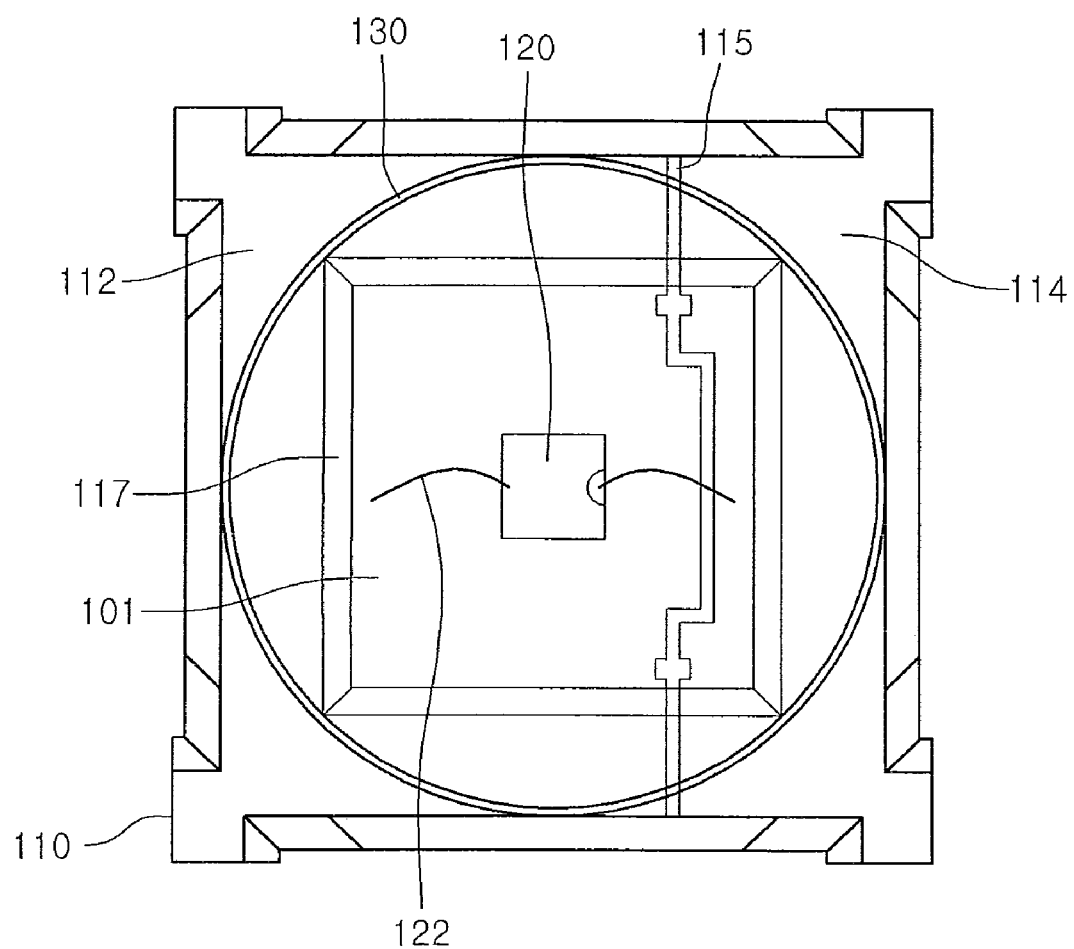
FIG. 2 is a plan view illustrating a trench of a package body of FIG. 1.
Figure 3:
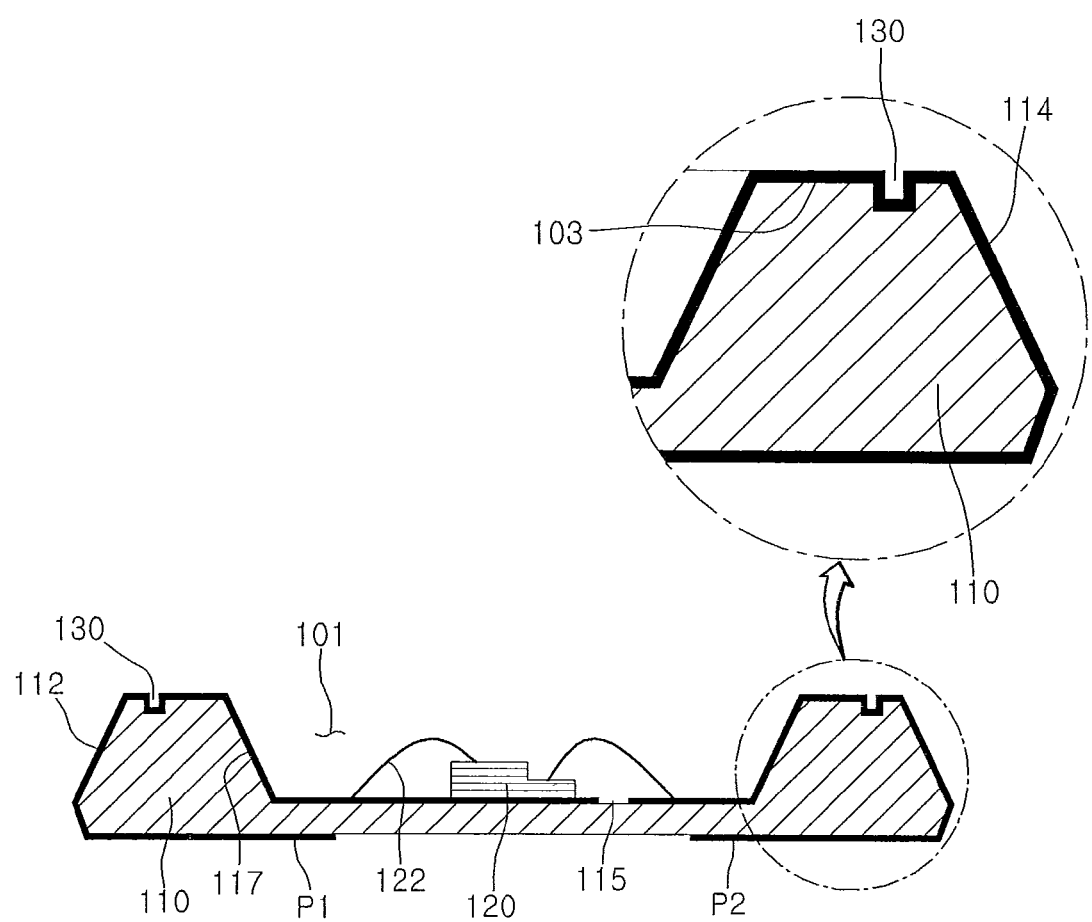
FIG. 3 is a side-sectional view of FIG. 2.

FIG. 1 is a side-sectional view of a light emitting device according to a first embodiment, FIG. 2 is a plan view illustrating a trench of a package body of FIG. 1, and FIG. 3 is a side-sectional view of FIG. 2.

Referring to FIGS. 1 to 3, a light emitting device 100 comprises a package body 110 having a cavity 101 and a trench 130, electrodes 112 and 114, a light emitting diode 120, a resin material 140, and a lens 150. The light emitting device 100 may be defined as a light emitting diode package. This term may be variously defined within the technical scope of embodiments.

For example, the package body 110 may be formed of a material having a high insulating property or a high thermal conductivity such as silicon, silicon carbide (SiC), and aluminum nitride (AlN). Hereinafter, for convenience of description, the package body 110 will refer to as a silicon-based wafer level package (WLP).

The package body 110 may comprise a frame having a polyhedral shape. The package body 110 may have the same length as each other or lengths different from each other in horizontal and vertical length, but it is not limited thereto.

The cavity 101 is defined in an inner upper portion of the package body 110. A predetermined etching process, e.g., a wet etching process and/or a dry etching process may be performed on the package body 110 to form the cavity 101 having a vessel (or a bathtub) shape or a depressed structure.

A lateral surface 117 of the cavity 101 may be perpendicular to a bottom surface of the cavity 101 or inclined outwardly with respect to a vertical shaft.

The cavity 101 of the package body 110 may have a single layer or a multi-layer structure. In case of the cavity 101 having the multi-layer structure, at least one cavity may be further defined in a portion of the bottom surface of the cavity 101.

Referring to FIGS. 2 and 3, the trench 130 is defined around a top surface of the package body 110. The trench 130 is disposed along an outer circumference of the cavity 101 by a predetermined depth. The trench 130 may have a shape different from an outer shape of the cavity 101, e.g., a circular or an oval shape.

Referring to FIG. 3, the trench 130 may have a depth less than about 30 um from a top surface 103 of the package body 110. The depth of the trench 130 may be defined by considering prevention of resin overflow and electrode formation.

The dry etching process and/or the wet etching process may be performed to form the trench 130. In detail, in the dry etching process, a mask layer may be formed on a surface of the package body 11, and then, the mask layer may be patterned to form a mask pattern having a desired shape using exposing, developing, and etching processes of photolithography processes. An open region having a trench shape is formed using the mask pattern, and then, the dry etching process is performed. Reactive ion etching (RIE), magnetically enhanced reactive ion etching (MERIE), inductively coupled plasma (ICP) processes using plasma may be selectively performed in the dry etching process. The dry etching process may be performed on the package body 110 to form the trench 130 having the predetermined depth (e.g., less than about 30 um).

In the wet etching process, when the mask pattern having the circular or oval shape is formed on the surface of the package body 110, the trench 130 having the predetermined depth may be formed using a wet etching solution.

The wet etching process may be performed after the dry etching process. At this time, the wet etching process is an isotropic wet etching process. At least one of an acetic acid, a hydrofluoric acid, and a nitric acid may be used as the wet etching solution, or a solution in which the etching solutions are mixed at a predetermined ratio may be used as the wet etching solution.

The trench 130 may be formed in the package body 110 before or after the cavity 101 is formed. The trench 130 may have a close-loop shape in which a cut portion does not exist or an open-loop shape in which the cut portion exists.

The plurality of electrodes 112 and 114 are disposed on the surface of the package body 110. The electrodes 112 and 114 are divided by an opened portion 115 through which the top surface of the package body 110 is partitioned into both sides. Each of the electrodes 112 and 114 may extend from the bottom surface of the cavity 101 up to the top surface, a lateral surface, and a bottom surface of the package body 110. Both ends of the electrodes 112 and 114 may be disposed on the bottom surface of the package body 110 and used as external electrodes P1 and P2. The electrodes 112 and 114 may be disposed on the trench 130 and in a region except the opened portion 115.

E-beam, sputtering, and electro plating deposition processes may be performed to form the electrodes 112 and 114.

The plurality of electrodes 112 and 114 may have different electrode patterns according to a structure of the cavity 101 and a mounting position of the light emitting diode 120, respectively, but it is not limited thereto. Any one of the plurality of electrodes 112 and 114 may have a via structure.

At least one light emitting diode 120 is disposed on the cavity 101 of the package body 110. An LED chip may be used as the light emitting diode 120.

The light emitting diode 120 may selectively comprise a red LED chip, a blue LED chip, a green LED chip, an ultraviolet (UV) LED chip, and a yellow LED chip, but it is not limited thereto. An electrostatic protection device may be mounted on the package body 110, or an ion implantation or diffusion process may be performed on the package body 110 to realize the electrostatic protection device. The electrostatic protection device may be realized as a zener diode for protecting the light emitting diode 120.

The light emitting diode 120 may be connected to the plurality of electrodes 112 and 114 using wires 120. Wire bonding, die bonding, and flip bonding processes may be selectively performed according to the chip types of the light emitting diode 120 to connect the light emitting diode 120 to the electrodes 112 and 114. The connection structure of the light emitting diode 120 may be variously modified according to a type of LED chip, the number of LED chip, and patterns of the electrodes 112 and 114, but it is not limited thereto.

The resin material 140 is filled into the cavity 101. The resin material 140 may comprise a transparent insulating material, e.g., a resin material such as an epoxy resin or silicon or a polymer material, but it is not limited thereto. A liquid resin material is dispensed to form the resin material 140.

At least one phosphor of phosphors (not shown) such as red, green, and blue phosphors may be added to the resin material 140, and this may be changed within the technical scope of embodiments.

The resin material 140 seals portions of the light emitting diode 120 and the electrodes 112 and 114 to protect them. The lens 150 is disposed on the resin material 140. A transparent resin material may be dispensed to form the lens 150 before or after the resin material 140 is hardened. The lens 150 may be changed in shape according to a shape of the trench 130 and an amount of the dispensed resin material.

The trench 140 may prevent the resin material dispensed for forming the lens 150 from overflowing. Thus, an outer shape of the lens 150 may be uniform.

The outer shape and size of the lens 150 may be changed according to the shape and size of the trench 140. For example, when the trench has the circular shape, the outer shape of the lens 150 may have a circular shape. Also, when the trench has the oval shape, the outer shape the lens 150 may have an oval shape. An orientation angle may be adjusted according to the shape of the lens 150 using the trench 130.

A process for manufacturing the light emitting device according to the first embodiment will now be roughly described.

The cavity 101 is formed in the inner upper portion of the package body 110, and the trench 130 is formed around the outside of the cavity 101. The plurality of electrodes 112 and 114 are formed on the package body 110 and the surface of the cavity 101. The light emitting diode 120 is mounted on the electrodes 112 and 114. The resin material is formed in the cavity 101, and the lens 150 is formed inside the trench 130 on the resin material 140.

Figure 4:
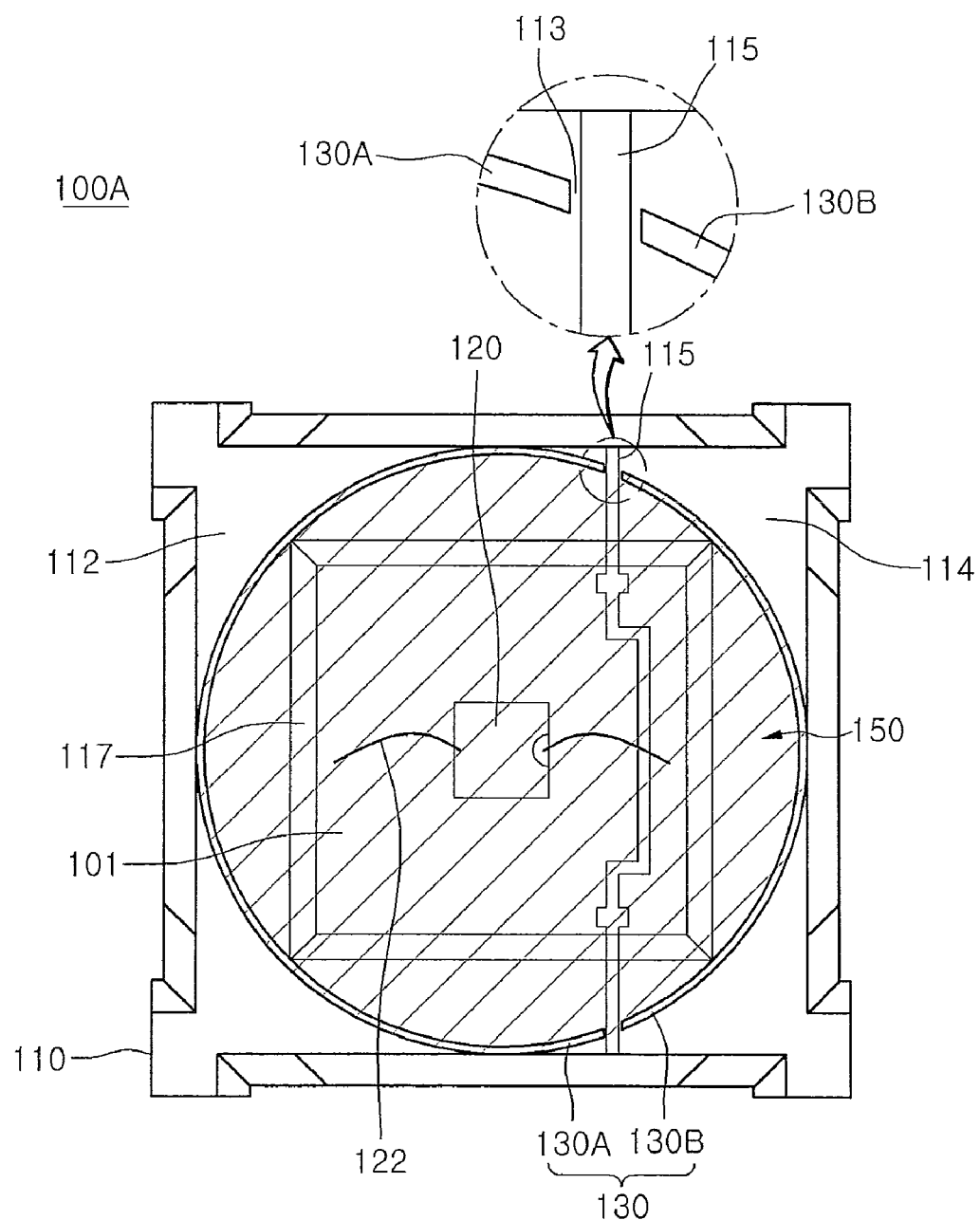
FIG. 4 is a plan view of a light emitting device according to a second embodiment.

FIG. 4 is a plan view of a light emitting device according to a second embodiment. In the following description of the second embodiment, duplicate descriptions for elements which are the same as those of the first embodiment will be omitted.

Referring to FIG. 4, in a light emitting device 100A, a trench 130 is disposed around a cavity 101 of a package body 110.

The trench 130 may have a circular shape and be divided into a plurality of trenches 130A and 130B that does not communicate with each other. Both ends of the plurality of trenches 130A and 130B are spaced a predetermined gap 113 from an opened portion 115. Thus, the opened portion 115 may divide the plurality of trenches 130A and 130B and a plurality of electrodes 112 and 114 into both sides thereof.

When the trenches 130A and 130B are not formed in the opened portion 115, it may prevent the plurality of electrodes 112 and 114 from being electrically shorted within the opened portion 115.

Two or more trenches 130 may be formed, and each of the trenches may have the circular shape. The number of trenches may be changed within the technical scope of embodiments.

Figure 5:
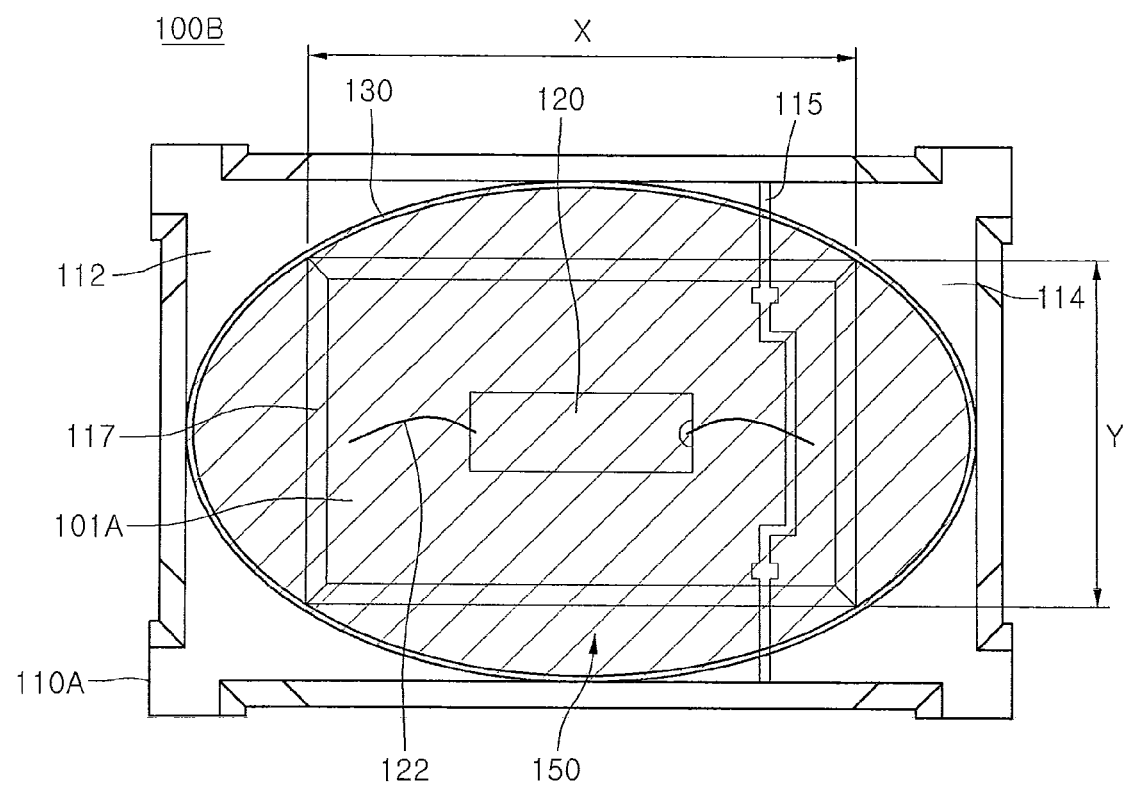
FIG. 5 is a plan view of a light emitting device according to a third embodiment.

FIG. 5 is a plan view of a light emitting device according to a third embodiment. In the following description of the third embodiment, duplicate descriptions for elements which are the same as those of the first embodiment will be omitted.

Referring to FIG. 5, a light emitting device 100B comprises a package body 110A having a rectangular shape and a cavity 101A having a rectangular shape. The package body 110A has a horizontal length X and a vertical length Y which are different from each other. The cavity 101A having the rectangular shape may be disposed inside the package body 110A. The cavity 101A may have a shape different from that of the package body 110A, e.g., a square or circular shape, but it is not limited thereto.

A trench 130 is disposed around the outside of the cavity 101A. The trench 130 may have an oval shape. A lens 150 having an oval shape may be manufactured by the trench 130. Light may be oriented in a specific direction or in a specific region due to the lens 150.

The light emitting device 100B may have a large orientation angle in an X-axis direction and a small orientation angle in a Y-axis direction due to the cavity 101A having the rectangular shape and the lens 150 having the oval shape.

Figure 6:
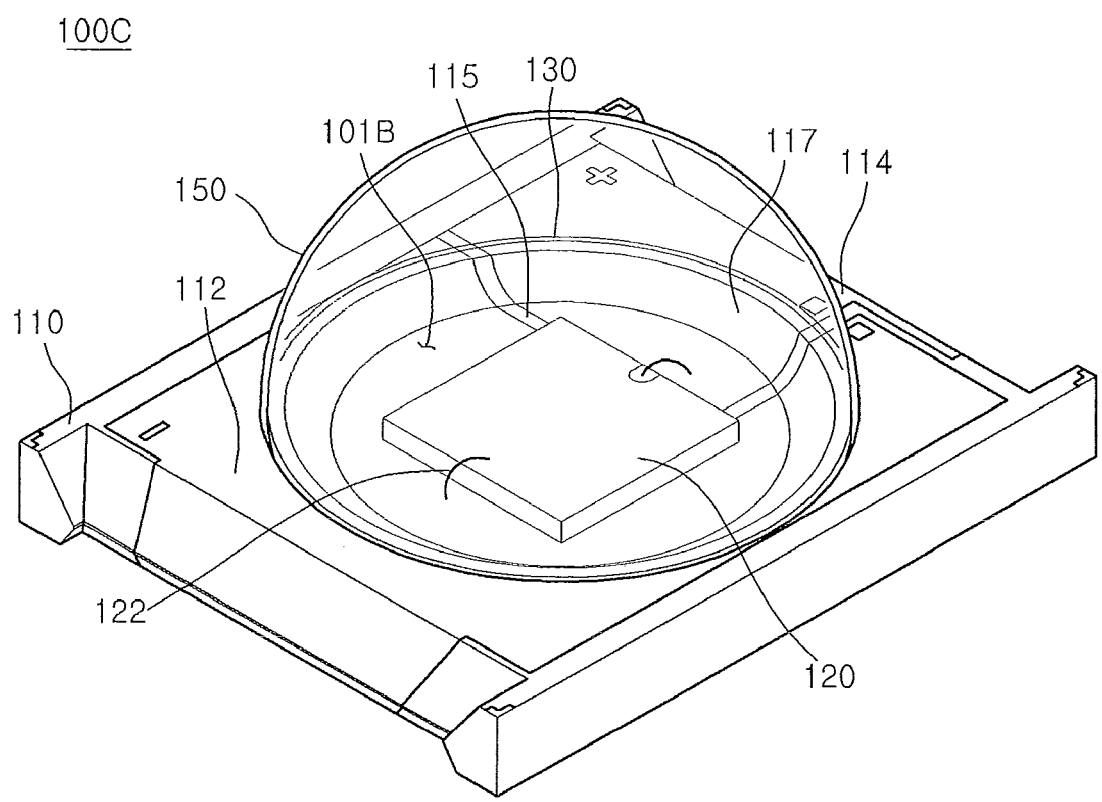
FIG. 6 is a perspective view of a light emitting device according to a fourth embodiment.

FIG. 6 is a perspective view of a light emitting device according to a fourth embodiment. In the following description of the fourth embodiment, duplicate descriptions for elements which are the same as those of the first embodiment will be omitted.

Referring to FIG. 6, a light emitting device 100C comprises a package body 110 in which a cavity 101B having a circular shape is provided. An outer shape of the cavity 101B has the circular shape.

A resin material is filled in the cavity 101B, and a lens 150 is disposed on the resin material. An outer surface of the lens 150 is disposed along the trench 130.

The trench 130 is spaced the same distance from a circumference of the cavity 101B. Also, the outer surface of the lens 150 may be spaced the same distance from the circumference of the cavity 101B. Thus, light emitted from the lens 150 may be irradiated with a smooth distribution.

Dry and wet etching processes may be selectively performed to form the cavity 101B having the circular shape. When the wet etching process is performed after the dry etching process is performed, an isotropic wet etching process is performed. Thus, the cavity 101B may have a lateral surface 117 curved with a predetermined curvature.

The trench 130 of the package body 110 may be formed after the cavity 101B is formed first, and the process procedure may be changed.

Figure 7:
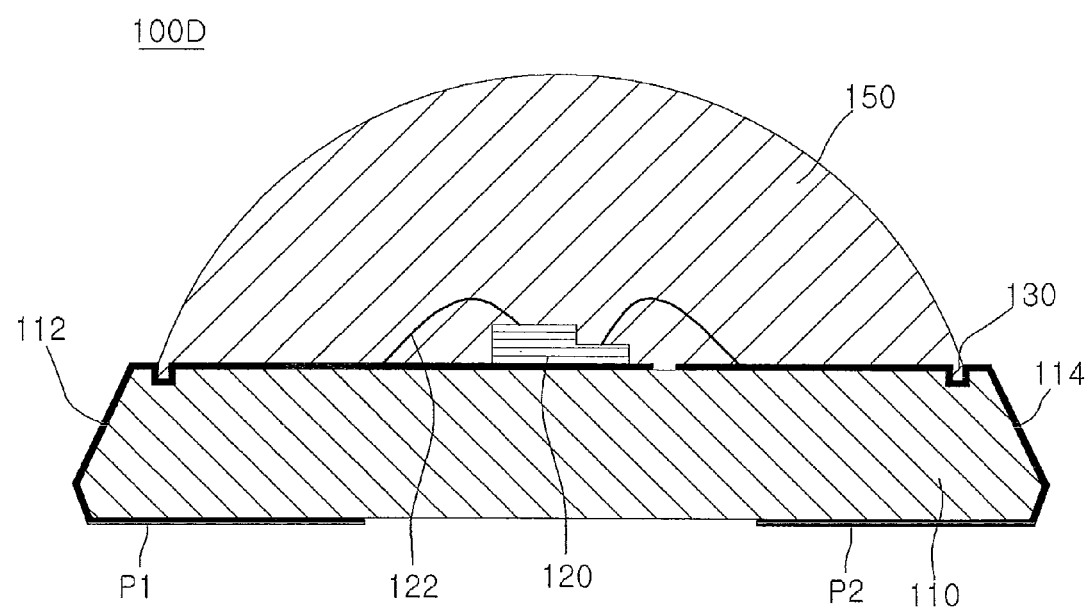
FIG. 7 is a side-sectional view of a light emitting device according to a fifth embodiment.

FIG. 7 is a side-sectional view of a light emitting device according to a fifth embodiment. In the following description of the fifth embodiment, duplicate descriptions for elements which are the same as those of the first embodiment will be omitted.

Referring to FIG. 7, a light emitting device 100D has a flat top surface without forming a cavity on a package body 110.

A trench 130 having a circular or oval shape is disposed around an outer top surface of the package body 110. A plurality of electrodes 112 and 114 may be disposed around the outer top surface of the package body 110. A light emitting diode 120 is attached in the inside or a central region of the trench 130. The light emitting diode 120 is electrically connected to the plurality of electrodes 112 and 114.

According to the fifth embodiment, the number of processes for forming the cavity in the silicon-based package body 110 may be reduced.

Technical characteristics of the first to fifth embodiments are not limited to a characteristic of each of the embodiments, and any embodiment may be selectively applied to another embodiment within the technical scope of the embodiments.

In the description of embodiments, it will be understood that when a layer (or film), region, pattern or structure is referred to as being 'on' another layer (or film), region, pad or pattern, the terminology of 'on' and 'under' comprises both the meanings of 'directly' and 'indirectly'. Further, the reference about 'on' and 'under' each layer will be made on the basis of drawings.

Any reference in this specification to "one embodiment," "an embodiment," "example embodiment," etc., means that a particular feature, structure, or characteristic described in connection with the embodiment is comprised in at least one embodiment of the invention. The shapes of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising: a package body comprising a trench; a first electrode and a second electrode on and/or in the package body; a wire electrically connected to the second electrode;
a light emitting diode on the first electrode, the light emitting diode being electrically connected to the second electrode through the wire; and
a lens on the package body and covering the wire,
wherein at least one of the first electrode and the second electrode extends up to a bottom surface of the package body via the trench disposed in the uppermost surface of the package body.

2. The light emitting device according to claim 1, wherein the package body comprises a cavity in which the light emitting diode is disposed.

3. The light emitting device according to claim 2, wherein an outer shape of the cavity has the same shape as that of the trench or a polyhedral shape.

4. The light emitting device according to claim 2, wherein a lateral surface of the cavity is inclined.

5. The light emitting device according to claim 2, wherein a transparent resin material or a transparent resin material in which a phosphor is added is filled in the cavity.

6. The light emitting device according to claim 1, wherein an outer lateral portion of the lens is disposed in the trench.

7. The light emitting device according to claim 1, wherein the trench is defined by a plurality of trench structures.

* * * * *